(12) United States Patent
Wang

(10) Patent No.: US 6,574,254 B1
(45) Date of Patent: Jun. 3, 2003

(54) LASER DIODE PACKAGE WITH HEAT SINKING SUBSTRATE

(75) Inventor: Bily Wang, Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 10/068,531

(22) Filed: Feb. 8, 2002

(51) Int. Cl.[7] ................................. H01S 3/04
(52) U.S. Cl. ........................................ 372/34; 372/36
(58) Field of Search .................. 372/34, 36; 315/169.2, 315/169.1; 438/22, 29

(56) References Cited

U.S. PATENT DOCUMENTS 6,300,674 B1 * 10/2001 Wang ......................... 257/666

2002/0034834 A1 * 3/2002 Verdiell ...................... 438/22
2002/0037142 A1 * 3/2002 Rossi ........................... 385/92

* cited by examiner

*Primary Examiner*—Paul Ip
*Assistant Examiner*—Leith Al-Nazer
(74) *Attorney, Agent, or Firm*—H. C. Lin Patent Agent

(57) ABSTRACT

Thick metal plates are used both as leads and substrate of a laser diode package. The laser diode and the metal plate are covered with a sealing glue up to the outside end of the laser diode to form a unitary structure. The thick metal plates serve as a heat sink. The outside end of the laser diode is not covered with glue so that the emitted is not attenuated. A photo diode is used to monitor the emitted light intensity. The photo diode can share a common electrode with the laser diode by mounting the photo diode on a step-down metal plate, so that the light emitted from the inside end of the laser diode is only partially blocked.

7 Claims, 15 Drawing Sheets

LASER DIODE PACKAGE WITH HEAT SINKING SUBSTRATE

BACKGROUND OF THE INVENTION (1) Field of Invention

This invention relates to laser diode package, in particular to the heat sink of a laser diode package.

(2) Brief Description of Related Art

In the prior art of a laser diode, the substrate is an insulator, incapable of effectively sinking the heat generated in the laser diode. FIGS. 1–3 show such a prior art laser diode package. FIG. 1 shows the top view of a surface mount package. The substrate is the insulated substrate 10 of a printed circuit board. Metal plates 11, 12, 13 serve as leads. A metal pedestal 111 is place on the metal plate 11 for mounting a laser diode. Semicircular recesses 14 are cut into the metal plates, 11, 12, 13 for inserting clamping screws onto the substrate 10.

FIG. 2 shows a laser diode 15 mounted on the pedestal 111. The laser diode 15 emits light rays B and F left and right respectively of the laser diode 15 along the section line AA' as shown in FIG. 3. A photo diode 16 is mounted on the metal plate 11 for monitoring the light rays B. The light ray F is emitted from the package. The metal plate 11 serves as the lead for the bottom electrode of the laser diode 15. The top electrode of the laser diode 15 is wire bonded by wire 17 to the metal plate 12, serving as another lead for the laser diode 15. The top electrode of the photodiode 16 is wire-bonded by wire 18 to the metal plate 13.

A glue 19 is used to seal the laser diode 15 and the photo diode 16. The glue 19 covers up to the edge of the laser diode 15, leaving an open end to emit the light without attenuation. The metal plates 11, 12, 13 may each have plated through channels as shown in FIG. 3, or plated through holes (not shown) or folded plate (not shown) for easy surface mounting to a circuit board.

Such a prior art package has poor heat sinking capability, because the printed circuit substrate is a poor heat conductor. When is laser diode is energized, the heat cannot be removed effectively and may cause the laser diode to be overheated.

SUMMARY OF THE INVENTION

An object of the present invention is to provide a laser diode package, capable of heat sinking effectively the heat generated in the laser diode. Another object of the invention is to provide a laser diode package having provisions to monitor the heat generated in the laser diode. Still another object of the invention is to provide means to automatically adjust the power generated by the laser diode.

These objects are achieved in this invention by using thick metal plates serving both as leads and substrate for the laser diode. The thick metal plates serve as good heat sinks. One of the thick plates has a step. A monitoring photo diode is mounted in the lower platform of the step. A glue is used to seal the laser diode and the photo diode and to aggregate the metal plates, the laser diode and the photo diode together as a unitary structure.

DETAILED DESCRIPTION OF THE INVENTION

Figure 1:
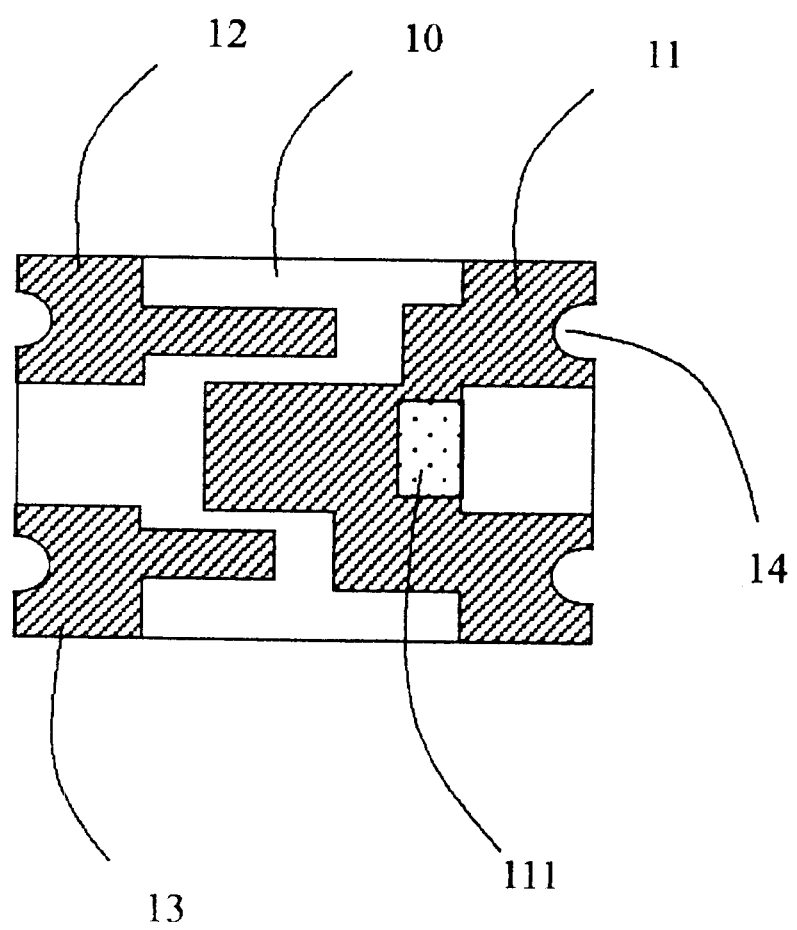
FIG. 1 shows a prior aft laser diode substrate with plated metal.
Figure 2:
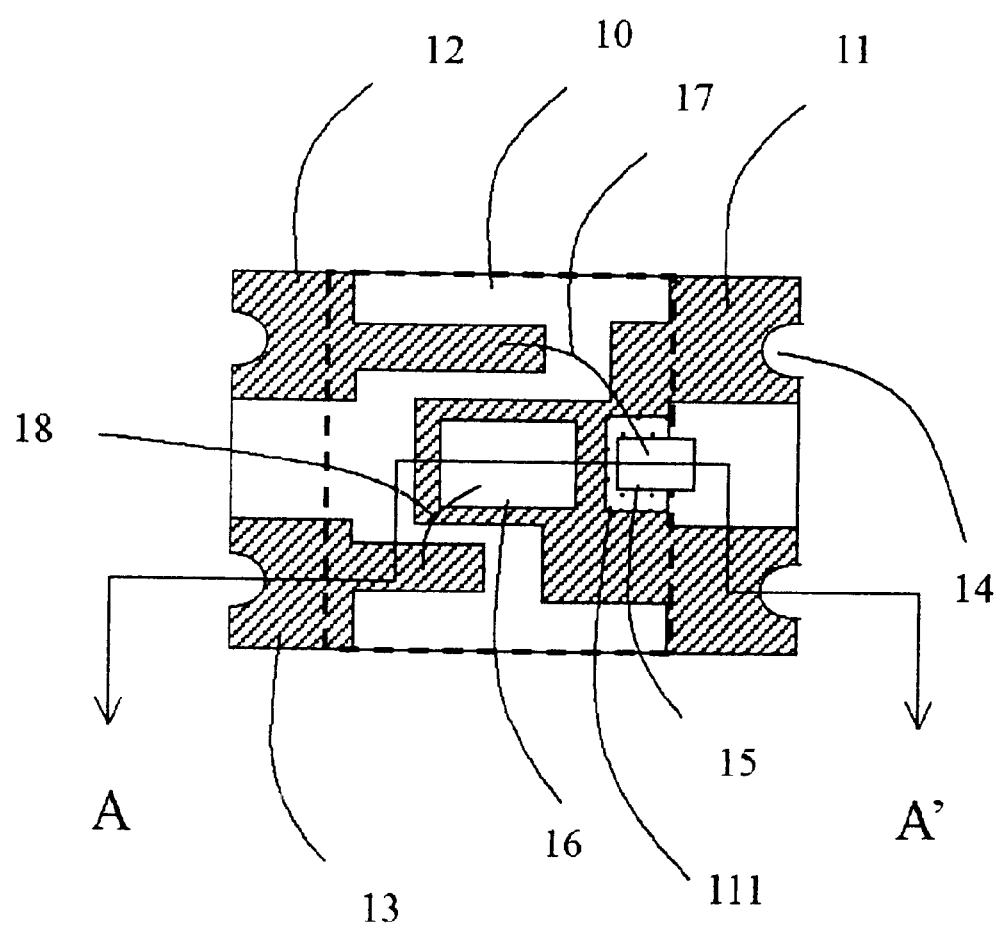
FIG. 2 shows the prior substrate mounted with a laser diode and sealed in glue.
Figure 3:
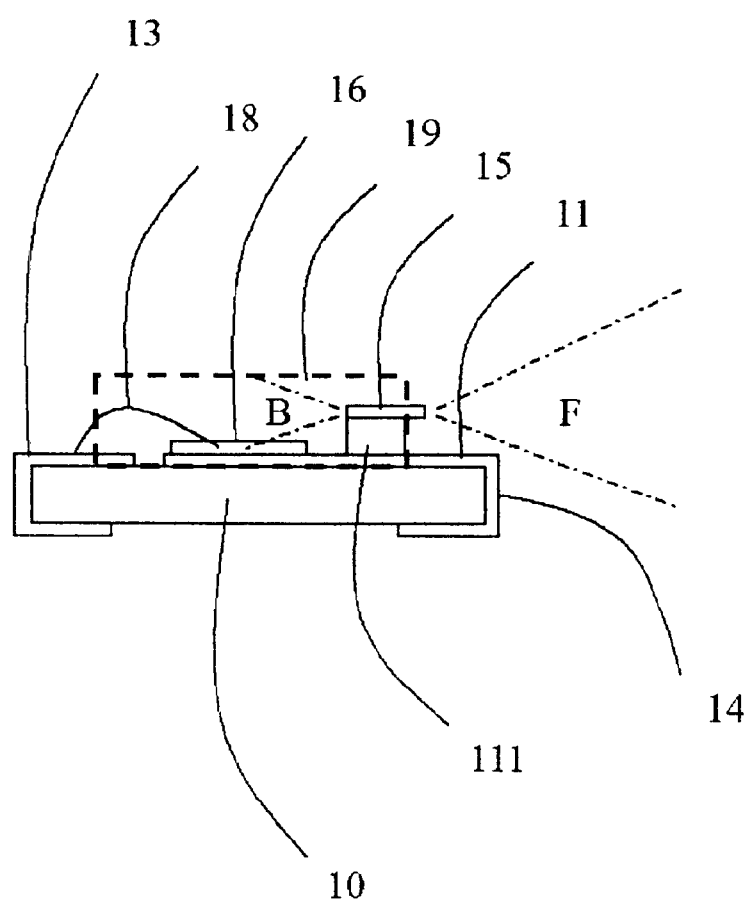
FIG. 3 shows the side view of the prior art laser diode package.
Figure 4:
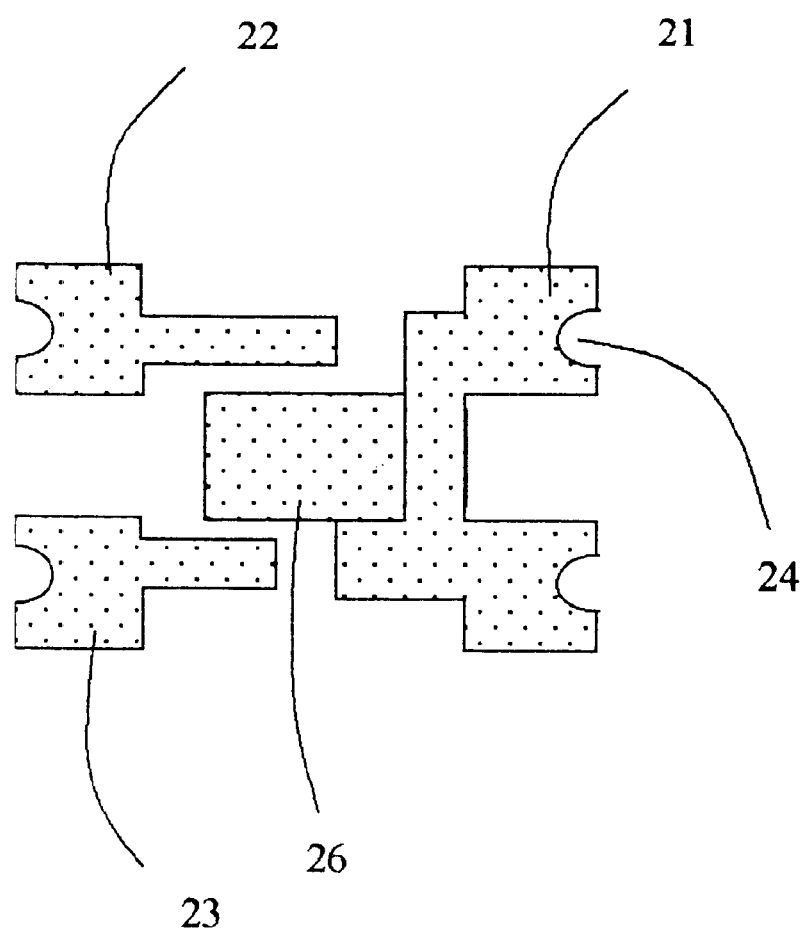
FIG. 4 shows the top view of the heat sinking metal plates of the present invention.

FIG. 4 shows the top view of the basic structure of the present invention. The substrate is made of three thick metal plates 21, 22, 23. Each metal plate has an extension serving as an electric lead and a semicircular cut 24 for the convenience of testing tool. The cut 24 is not a necessary part of the present invention as illustrated in other embodiments of the present inventions shown in FIGS. 6, 8, 9, 10, 11, 12 and 13.

Figure 5:
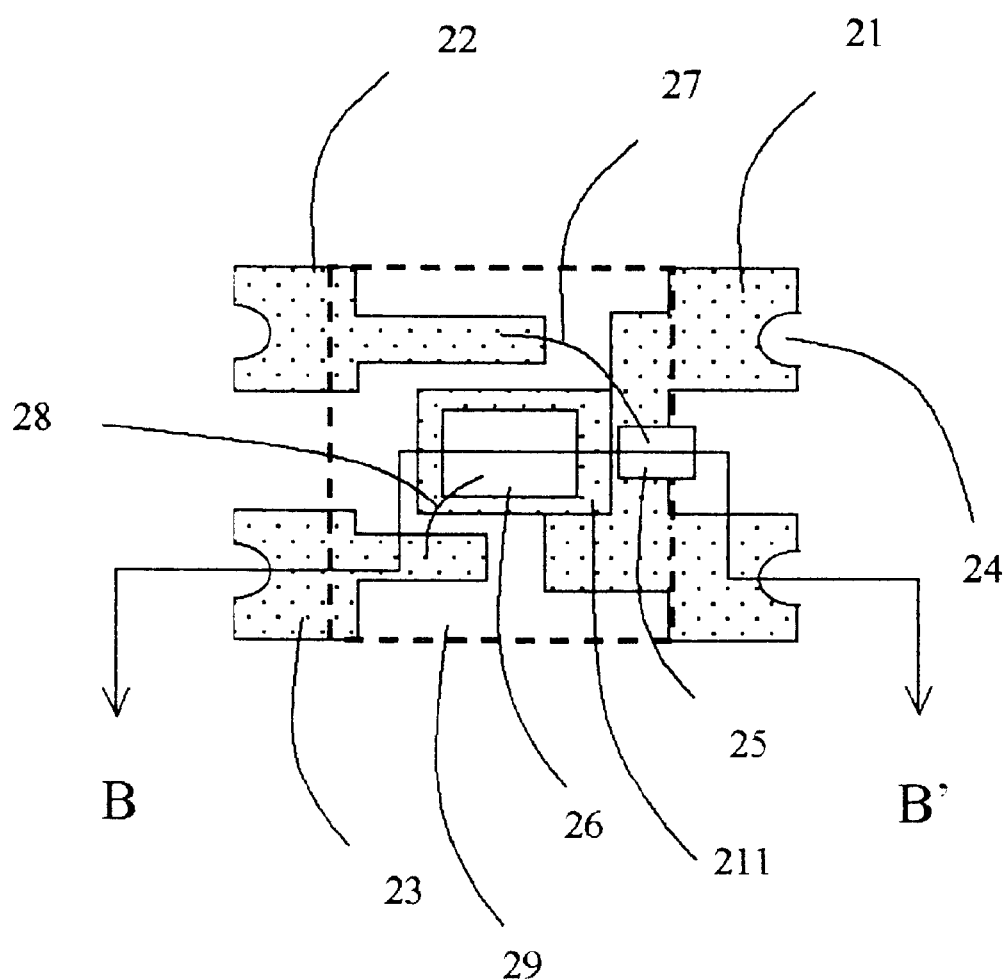
FIG. 5 shows the top view of the structure with laser diode, monitoring diode and sealing glue.

FIG. 5 shows the top view with the laser diode 25 to emit light and a photo diode 26 to monitor the emitted light ray. A bonding wire 27 connects the top electrode of the laser diode 25 to metal plate 22. A glue 29 covers and seals the laser diode 25, the photo diode 26 over the metal plates 21, 22, 23 to form a unitary structure. The monitor can feedback a signal for automatically controlling the intensity of the emitted light.

Figure 6:
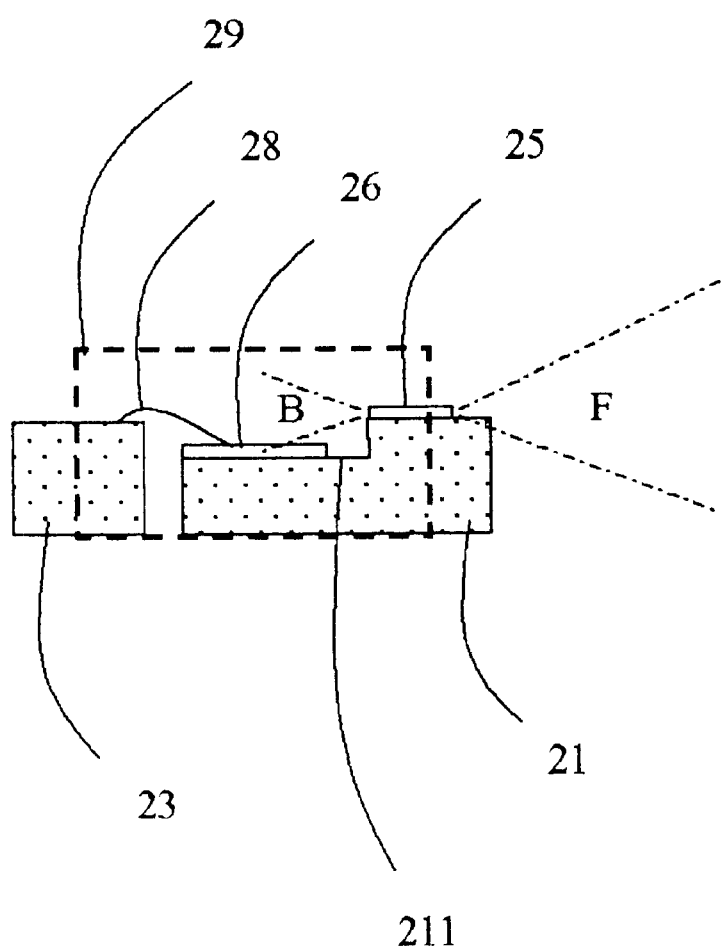
FIG. 6 shows the side view of FIG. 5 along the BB' section line.

FIG. 6 shows the side view of FIG. 5 along the BB' section line. The thick metal 21 has a step 211. The laser diode 25 is mounted on the upper pedestal of the step to emit light ray B toward the left side and to emit light ray F toward the right side. A photo diode 26 is mounted on the lower step 211 with the bottom electrode of the photo diode 26 in contact with the metal plate 21 and the upper electrode of the photo diode wire bonded by wire 28 to the thick metal plate 23. The glue 29 is used to seal the laser diode 25 and the photo diode 26 over the metal plates 21, 22, 23 to form a unitary structure.

Figure 7:
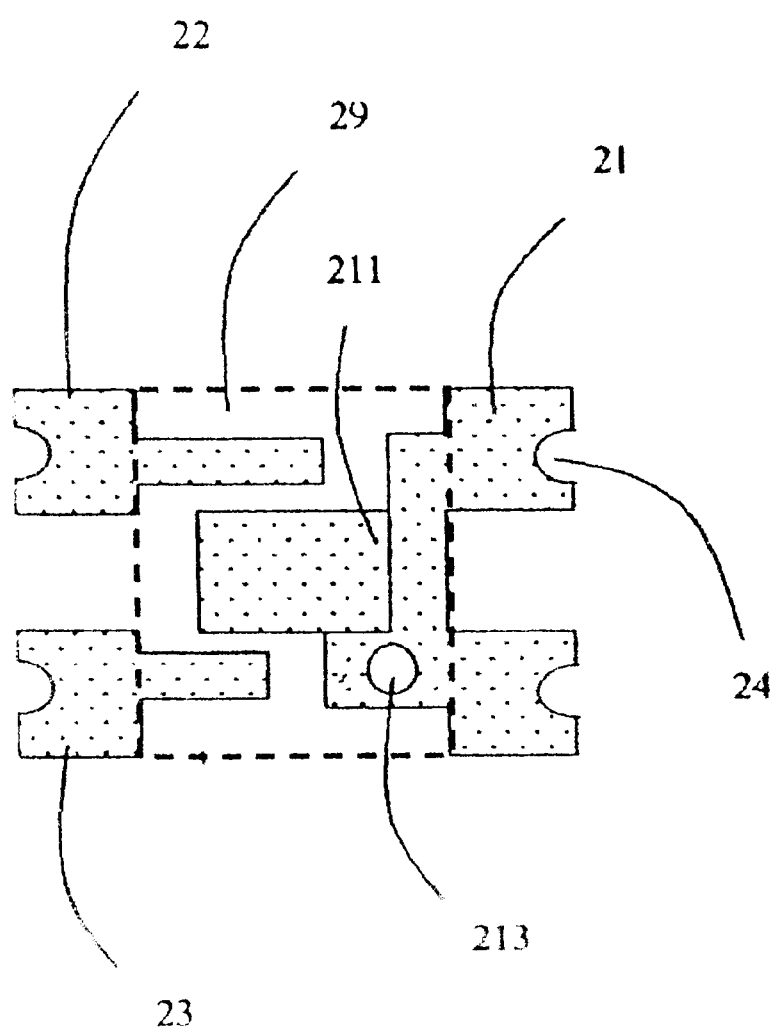
FIG. 7 shows the top view of the metal plates of a second embodiment of the present invention.

FIG. 7 shows a second embodiment of the invention. The structure is similar to that in FIG. 4, except that a through-hole 213 is drilled in the metal plate 21. When the molten glue 29 pours over the structure, the glue also flows into the hole 213. When the glue 29 solidifies, the glue in the through-hole strengthens the unitary structure.

Figure 8:
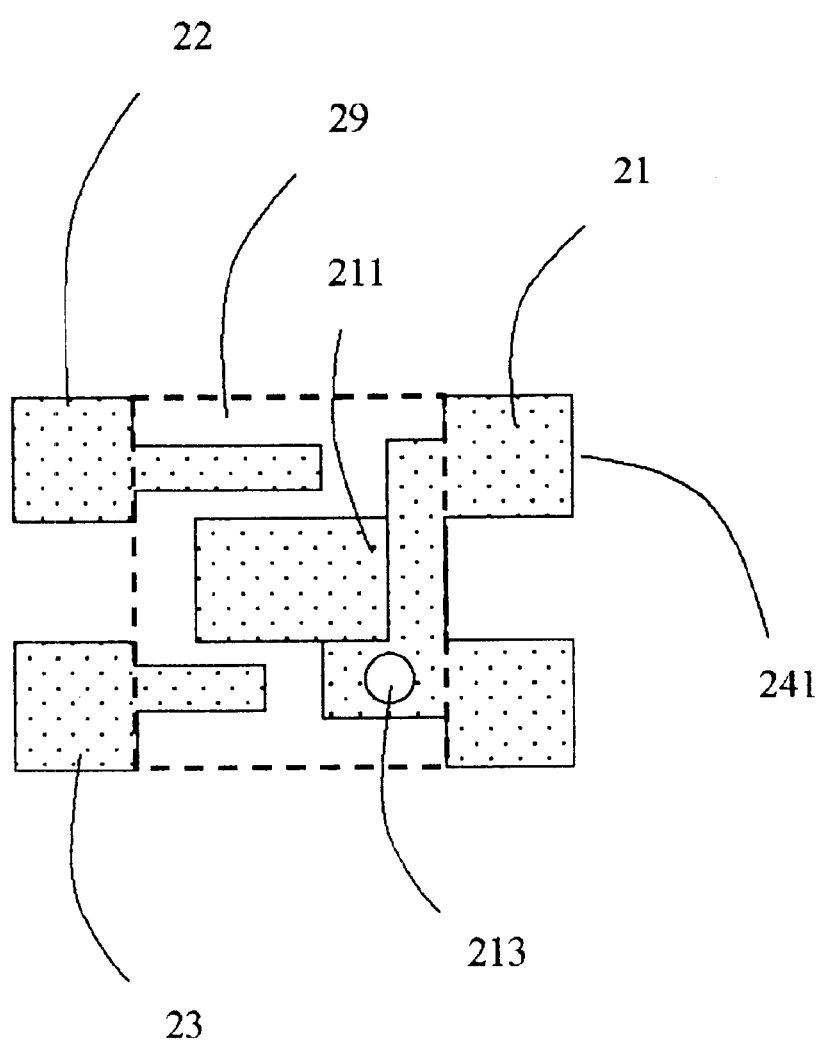
FIG. 8 shows the top view of the metal plates of a third embodiment of the present invention.

FIG. 8 shows a third embodiment of the present invention. The structure is similar to that in FIG. 7 except that the thick metal plates 21, 22, 23 do have not a semicircular recess at the ends, but have a straight outside edge such as edge 241.

Figure 9:
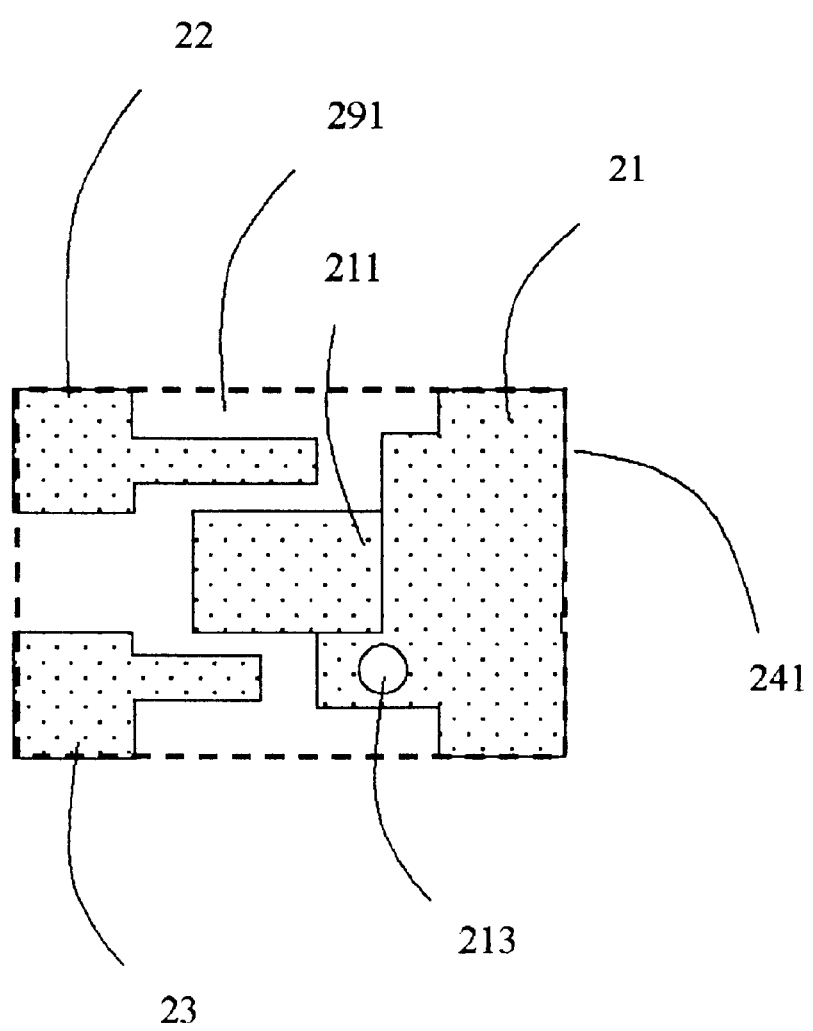
FIG. 9 shows the top view of the metal plates of a fourth embodiment of the present invention.

FIG. 9 shows a fourth embodiment of the present invention. The structure is similar to that in FIG. 8 except that the glue 291 covers up to the edge 241 of the metal plates 21, 22, 23.

Figure 10:
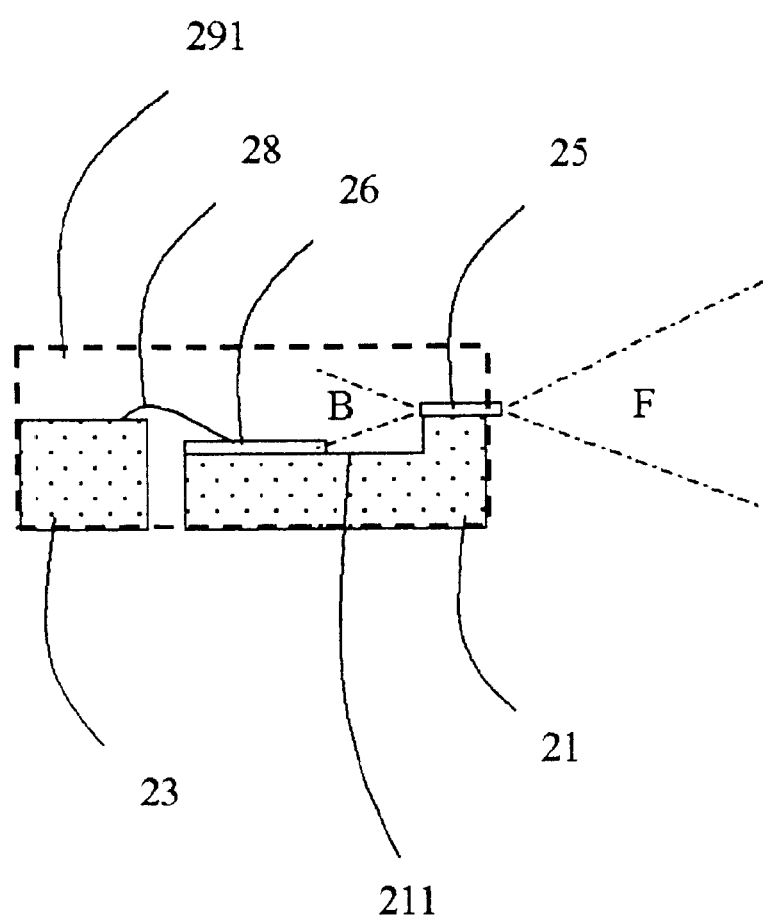
FIG. 10 shows side view of laser diode package of FIG. 9.

FIG. 10 shows the side view of FIG. 9. The laser diode 25 is covered by the glue 291 except at the outer edge, so that the light ray F can be emitted from the laser diode 25 without being attenuated by any glue. The left-hand light ray B is incident on the photo diode 26 through the sealing glue 291.

Figure 11:
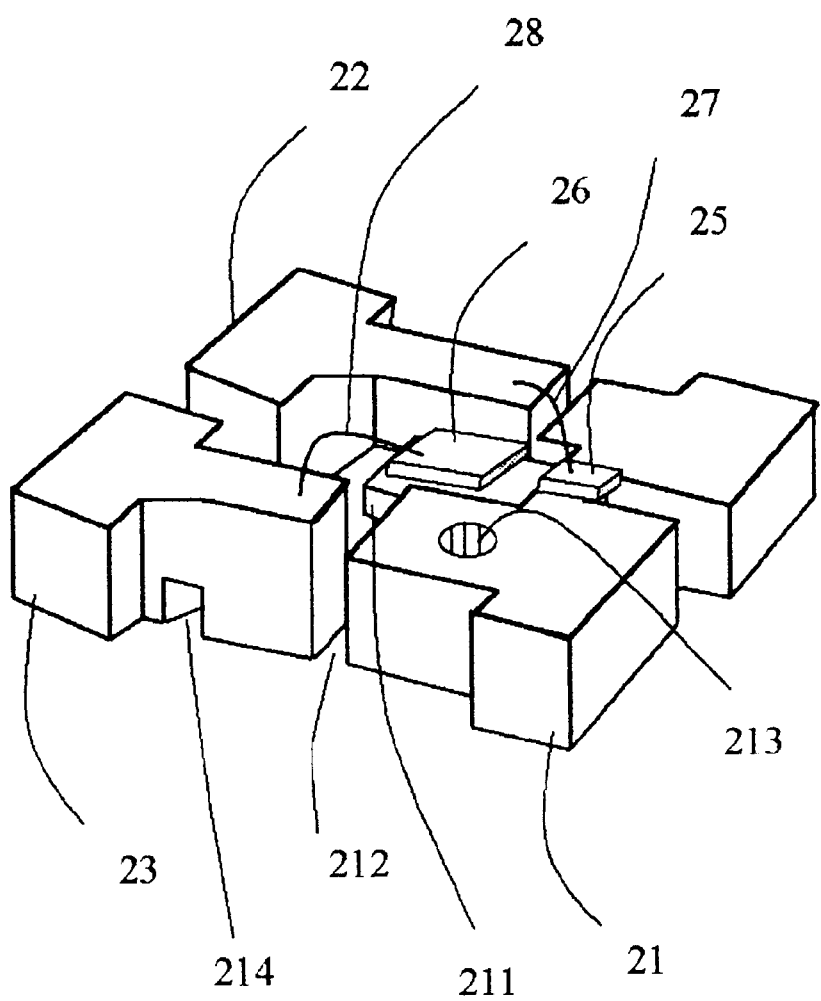
FIG. 11 shows the 3-dimensional view of the fifth embodiment of the present invention.

FIG. 11 shows a fifth embodiment of the present invention. The 3-dimensional view of this structure is similar to that in FIG. 8, except that a groove 214 is inserted at the bottom of the metal plate 23. Similar groove may also be inserted under metal plates 21 and 22. When sealing glue engulfs the entire structure, the glue can pour into such groove as groove 214 to further strengthen the structure.

Figure 12:
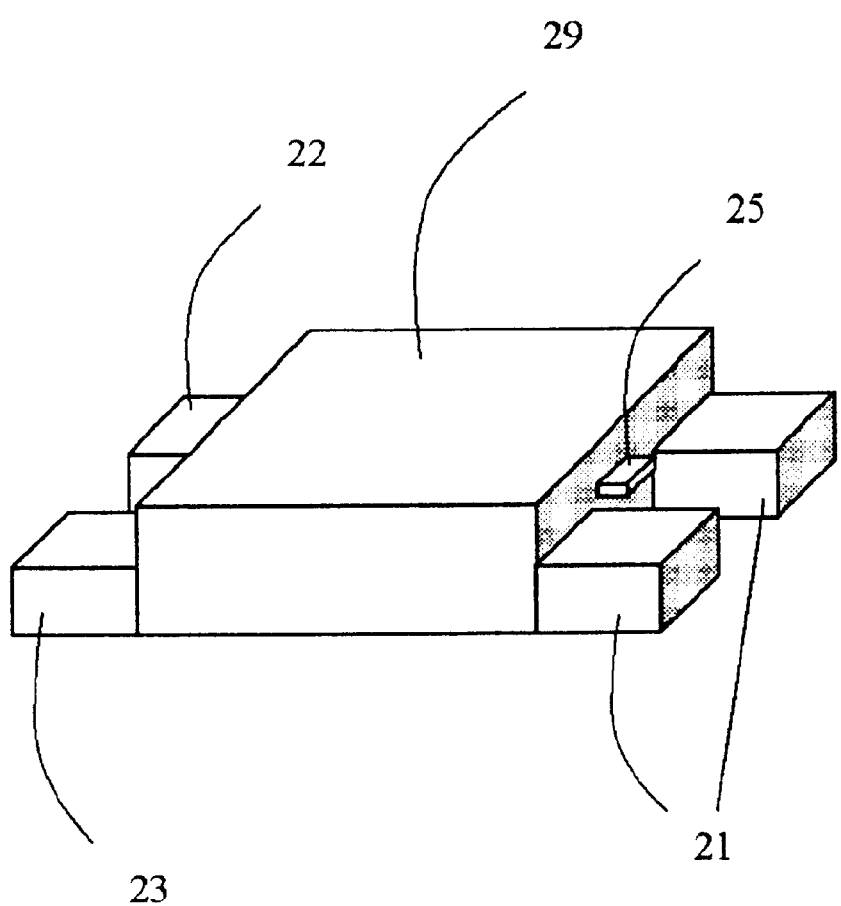
FIG. 12 shows the overall 3-dimensional view of laser diode package of the present invention.

FIG. 12 shows the overall 3-dimensional view of the structure shown in FIG. 8. Note that the glue 29 covers all the active components, leaving only the outside end of the laser 25 exposed for unattenuated emission of the laser light.

Figure 13:
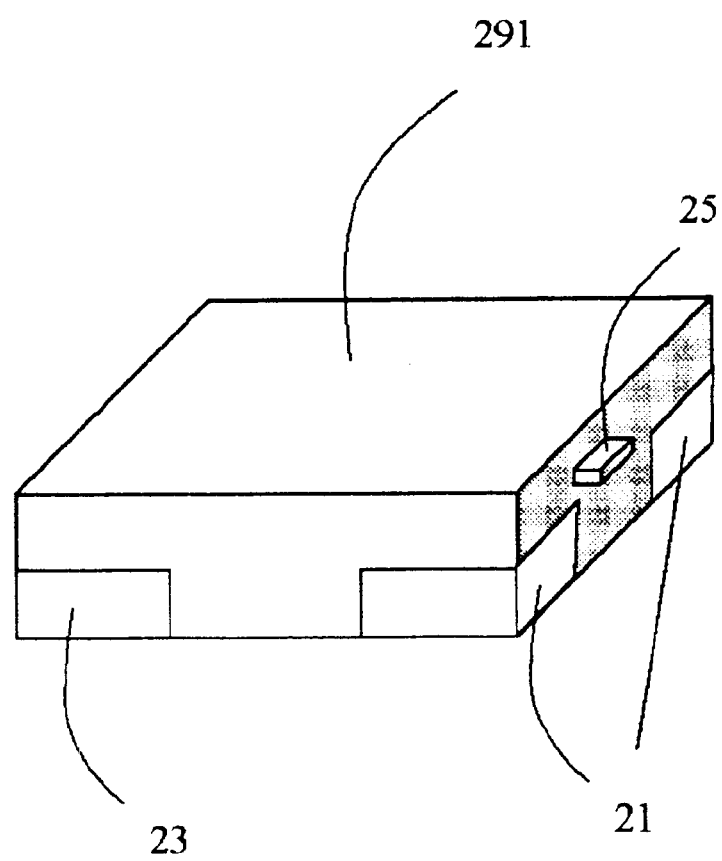
FIG. 13 shows the overall 3-dimensional view of another laser diode package of the present invention.

FIG. 13 shows that overall 3-dimentionsal view of the structure shown in FIGS. 9 and 10. Note that the glue 291 covers all the active components, leaving only the outside end of the laser diode 25 exposed for efficient emission of the laser light.

Figure 14:
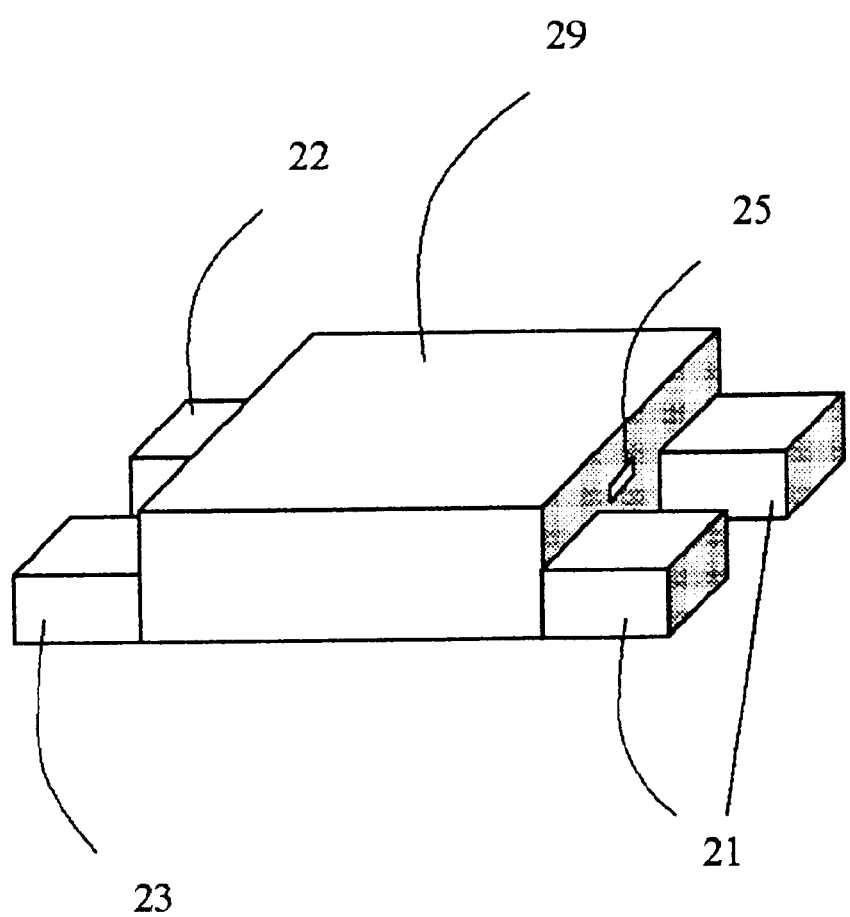
FIG. 14 is a modification of FIG. 12.

FIG. 14 is similar to FIG. 12 except that the exposed end section of the laser diode 25 does not protrude outside the vertical end of the sealing glue 29. The additional coverage of the glue offers more protection against dust contamination.

Figure 15:
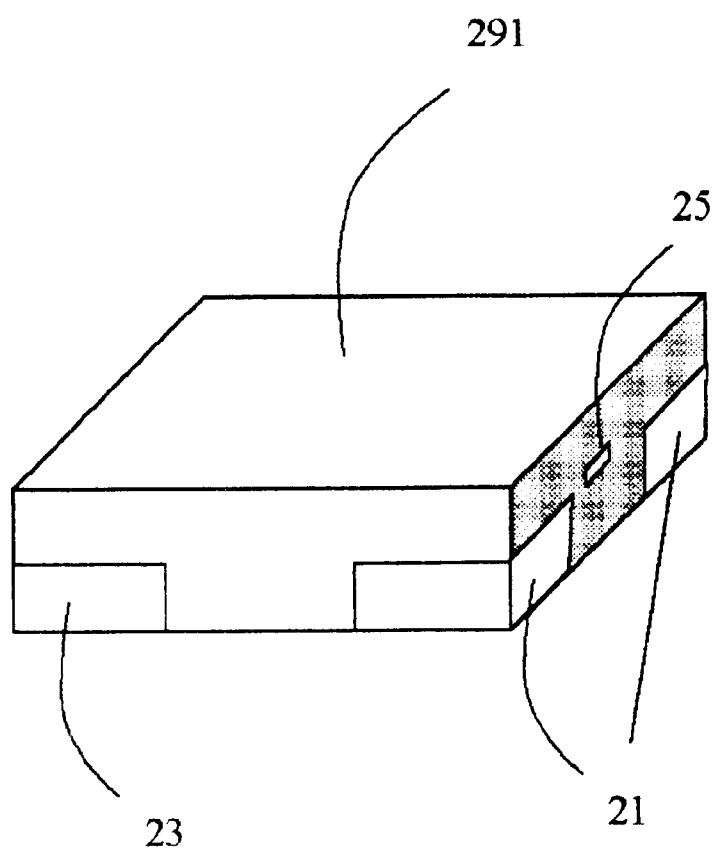
FIG. 15 is a modification of FIG. 13.

FIG. 15 is similar to FIG. 13 except that the exposed end section of the laser diode 25 does not protrude outside the vertical end of the of sealing glue 29. The additional coverage of the glue offers more protection against dust contamination.

While the preferred embodiments of the invention have been described, it will be apparent to those skilled in the art that various modifications may be made in the embodiments without departing from the spirit of the present invention. Such modifications are all within the scope of this invention.

What is claimed is:

1. A heat sinking laser diode package, comprising:

a laser diode;

more than one thick metal plates serving as external leads connected to said laser diode and as a substrate for mounting said laser diode, wherein said laser diode is mounted on a first metal plate of said thick metal plates serving as the lead for the bottom electrode of said laser diode, and the top electrode of said laser diode is wire-bonded to a second metal plate of said solid metal plates serving as the lead for the top electrode of said laser diode;

a glue for sealing said laser diode and for aggregating said metal plates with said laser diode as a unitary structure; and a photo diode mounted on said first metal plate of said thick metal plates to monitor the light emitted from said laser diode, wherein said first metal plate serves as a first electrode for said photo diode and the top electrode of said photo diode is wire bonded to a third metal plate of said thick metal plates serving as a lead for said photo diode, and wherein said first metal plate has a lower step for mounting said photo diode, so as not to block the light emitted from said laser diode.

2. The laser diode package as described in claim 1, further comprising a hole in at least one of said thick metal plate for said glue to flow in for strengthening the unitary structure.

3. The laser diode package as described in claim 1, wherein the outside end of each of said thick metal plates has a semicircular recess for anchoring test tool to be inserted.

4. The laser diode package as described in claim 1, wherein the outside edge of each of said thick metal plate is straight.

5. The laser diode package as described in claim 1, wherein said glue covers up to the ends of said thick metal plates, leaving the outside end of said laser uncovered for laser light to emit without attenuation.

6. The laser diode package as described in claim 5, wherein the outside end of said laser diode does not protrude outside said glue.

7. The laser diode package as described in claim 1, further comprising a groove underneath said thick metal plate for said glue to flow into.

* * * * *